(12) United States Patent
Brown et al.

(10) Patent No.: US 6,333,678 B1
(45) Date of Patent: Dec. 25, 2001

(54) METHOD AND APPARATUS FOR AGILE PHASE NOISE FILTERING USING PHASE LOCKED LOOPS

(75) Inventors: Matthew D. Brown, Kanata; Colin G. Kelly, Ottawa; Chung Wu, Kanata, all of (CA)

(73) Assignee: Nortel Networks Limited, Montreal (CA)

( * ) Notice: Subject to any disclaimer, the term of this patent is extended or adjusted under 35 U.S.C. 154(b) by 0 days.

(21) Appl. No.: 09/570,033

(22) Filed: May 12, 2000

(51) Int. Cl.[7] ....................................................... H03L 7/07
(52) U.S. Cl. ................................ 331/2; 331/25; 375/371; 375/376; 455/307
(58) Field of Search ........................... 331/2, 25; 375/371, 375/373, 376; 455/296, 307; 327/156

(56) References Cited

U.S. PATENT DOCUMENTS 5,579,351 11/1996 Kim ........................................ 375/371
6,094,569 * 7/2000 Wang ..................................... 331/11

FOREIGN PATENT DOCUMENTS 0 467 449 A2 * 1/1992 (EP) .

* cited by examiner

Primary Examiner—Siegfried H. Grimm

(57) ABSTRACT

A method and apparatus for filtering phase noise or jitter from a reference signal that may be of any arbitrary rate. By using a synthesizer to convert a signal at the output of a low noise signal source to a signal with frequency similar to a high speed output rate with desired relationship to the reference signal, a limitation normally caused by the narrow tuning range of a VCXO (a typical low noise signal source) can be overcome. Conversely, the desired high speed output rate may be converted to one similar to the VCXO frequency.

6 Claims, 6 Drawing Sheets

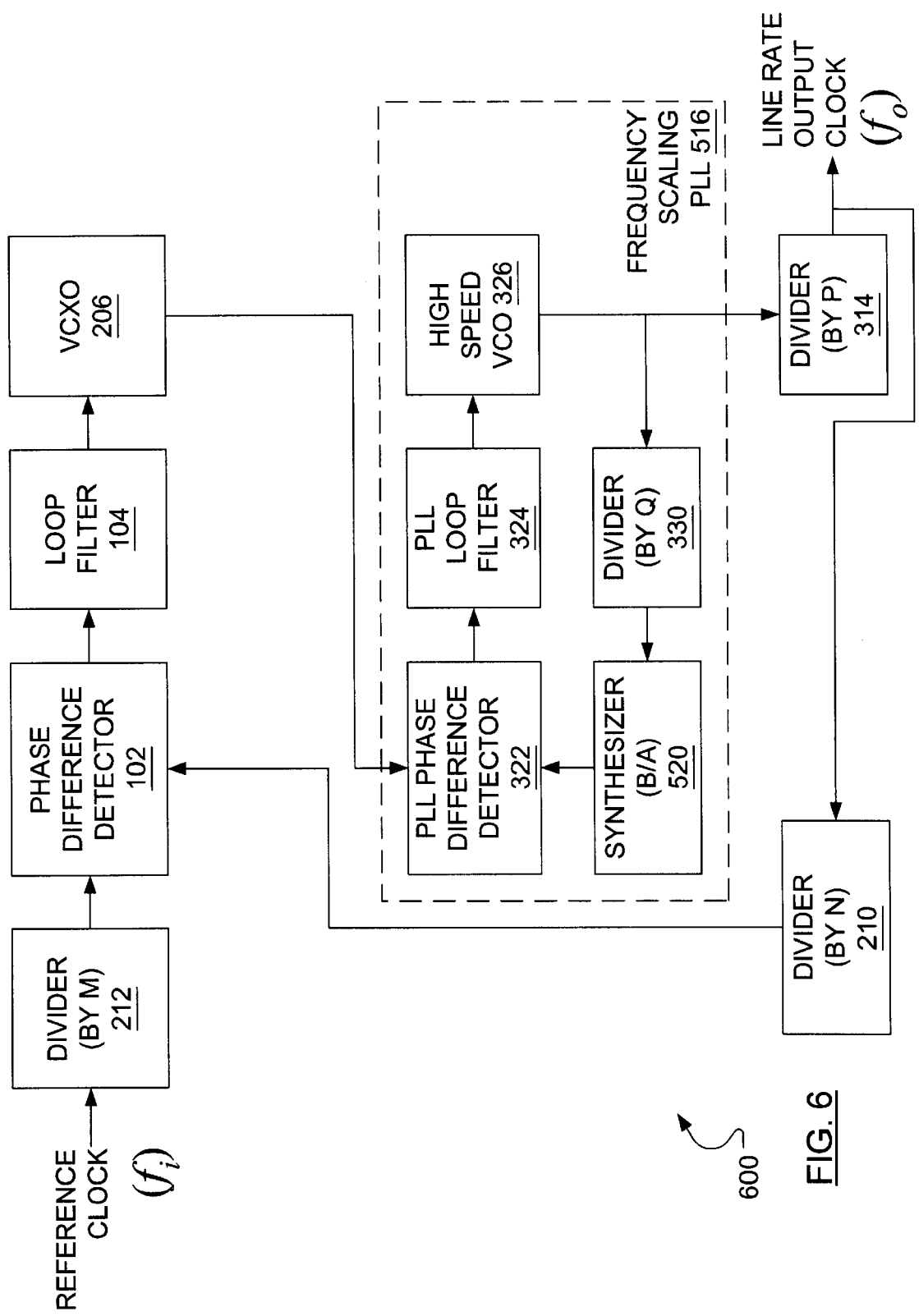

METHOD AND APPARATUS FOR AGILE PHASE NOISE FILTERING USING PHASE LOCKED LOOPS

FIELD OF THE INVENTION

The present invention relates to components for use in the transport of data upon digital networks, specifically to a method and apparatus for agile phase noise filtering.

BACKGROUND OF THE INVENTION

In digital communication systems, often a clock signal (or just "clock") must be recovered from a data signal in the receiver. Ideally, signal level transitions in the data signal are equally or regularly spaced, with a period determined by the bit rate of the signal. In real world applications, however, when a data stream arrives at the receiver, the period of successive bits may be slightly longer or shorter than the period defined by the bit rate of the given signal. This variability may be referred to as "jitter".

Commonly, filtering jitter from a clock signal makes use of a phase locked loop (PLL). A typical PLL filter includes a variable frequency signal source, a loop filter and a phase difference detector. In operation, a reference clock (the clock to be filtered) is compared, at the phase difference detector, to a signal output from the signal source. An indication of the phase difference detected between the signal source output and the reference clock is received by the loop filter and a filtered indication is passed to the signal source. Based on the filtered indication, the frequency of the signal output from signal source is adjusted. This adjustment acts to reduce the phase difference. After a "training" period, the resulting signal at the output of the signal source achieves a lock on the frequency and phase of the reference clock signal, and has qualities (i.e. low jitter) of the variable frequency signal source.

Often filters are described by a dynamic response. A desired dynamic response for a PLL may be attained by setting loop filter parameters appropriately. Bandwidth and damping factor are often the loop filter parameters that are set by a filter designer. The choice of these parameters depends upon the application. A wide bandwidth and low damping factor are desired to track a reference clock tightly (and therefore tolerate jitter on the reference clock), whereas a low bandwidth is desired to filter out jitter on the reference clock. Consequently, a compromise is typically required.

The standard for SONET (Synchronous Optical Networks) specifies jitter in three modes: jitter generation, jitter transfer and jitter tolerance. Jitter generation specifications identify how much jitter an interface may add to a data stream, assuming a stable reference clock. Jitter transfer specifications identify how a serial interface must process or filter jitter input from the reference clock, assuming a reference clock derived from a data stream. Jitter tolerance specifications identify how much jitter a serial receiver interface must be able to accept over a link while still recovering data within a bit error rate (BER) limit of the link.

When filtering jitter from a clock derived from a data stream, it is common practice to use a low bandwidth PLL. A frequency source within the low bandwidth PLL is required to have sufficiently low noise. More particularly, a voltage controlled crystal oscillator (VCXO) based PLL is required to meet jitter requirements of common transport protocols (e.g. SONET, Fiber Channel, etc.). The problem with using a VCXO is that the tuning range is very small, usually limited to a few hundred parts per million, and, as a result, different VCXO based PLLs are required in applications with different bit rates.

In the emerging Metropolitan network, there is a need to carry any protocol within existing (e.g. SONET) and emerging (e.g. Optical Network) data transportation facilities. To carry a signal through these networks it is necessary at a receiver to regenerate the data, recover a clock and re-time the data at optical interfaces external to, and within, these networks. There is a need, then, for a receiver that can work with any bit rate, provide compliant level of service, in this case jitter, regenerate a clean clock from a payload asynchronously mapped into a fixed rate carrier and reduce phase noise accumulated through a transmission system to meet jitter requirements.

Currently, PLLs based upon integrated voltage controlled oscillators (VCOs) are used to provide the ability to work with different bit rates, i.e. "bit rate agility". However, because the intrinsic phase noise of these integrated VCO solutions is high, the bandwidth of these PLLs cannot be reduced sufficiently low to filter out accumulated jitter at low frequencies.

SUMMARY OF THE INVENTION

The invention provides a method and apparatus for filtering the jitter (also known as phase noise) from a data stream or from a clock that may or may not be associated with a data stream. The term "agile" is used to identify the possibility that the clock or data stream to be filtered may be of any arbitrary rate. By using a synthesizer to convert the frequency of a low phase noise signal, output, for example, from a voltage controlled crystal oscillator (VCXO), to a frequency similar to a desired output rate, a limitation normally caused by the narrow tuning range of a VCXO may be overcome. Alternatively, the output rate may be converted to one similar to the VCXO frequency or both the output rate and VCXO frequency may each be converted to a common frequency. Synthesizer techniques which may be used include fractional counters, gapped clocks, dual dividers and direct digital synthesis, among others. When adapting a filter for a new bit rate, rather than replacing the VCXO, a designer need only alter synthesizer settings.

In accordance with an aspect of the present invention there is provided an agile phase noise filter including a phase locked loop having a variable frequency signal source for generating a low phase noise oscillator signal based on a voltage input and a synthesizer for scaling the oscillator signal to obtain a synthesizer signal.

In accordance with another aspect of the present invention there is provided an agile phase noise filter including a first phase difference detector for detecting a first phase difference and generating a signal representative of the first phase difference, where the first phase difference may exist between a reference signal and a first feedback signal, a first loop a filter for filtering the signal representative of the first phase difference to obtain a first filtered signal, a variable frequency signal source for generating a low phase noise signal, where a frequency of the low phase noise signal is varied according to changes in the first filtered signal and where the varying tends to reduce the first phase difference and a first synthesizer for generating a synthesized signal, where the synthesized signal is phase locked with the reference signal, is dependent upon the low phase noise signal and where a frequency of the synthesized signal has a first pre-determined relationship with a frequency of the reference signal.

In accordance with a further aspect of the present invention there is provided a low jitter method for tracking a reference clock including comparing a phase of the reference clock with a feedback signal to generate a comparison signal, filtering the comparison signal to obtain a filtered signal, controlling a low noise oscillator with the filtered signal and scaling a frequency signal output from the oscillator to obtain a scaled signal, wherein the feedback signal comprises a function of the scaled signal.

In accordance with another aspect of the present invention there is provided a method of filtering phase noise from a reference signal of arbitrary rate including detecting a phase difference between the reference signal and a feedback signal, generating a signal representative of the detected phase difference and filtering the signal representative of the detected phase difference to obtain a filtered signal. The method further includes using the filtered signal to vary a frequency of a low phase noise signal, where the varying tends to reduce the detected phase difference, and using a synthesizer to synthesize a synthesized signal phase locked with the input signal and dependent on the low phase noise signal, where a frequency of the synthesized signal has a first pre-determined relationship with a frequency of the reference signal.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

In the figures which illustrate an example embodiment of this invention:

FIG. 6 schematically illustrates a phase noise filter in accordance with a fourth embodiment of the present invention.

DETAILED DESCRIPTION OF THE PREFERRED EMBODIMENTS

Figure 1:
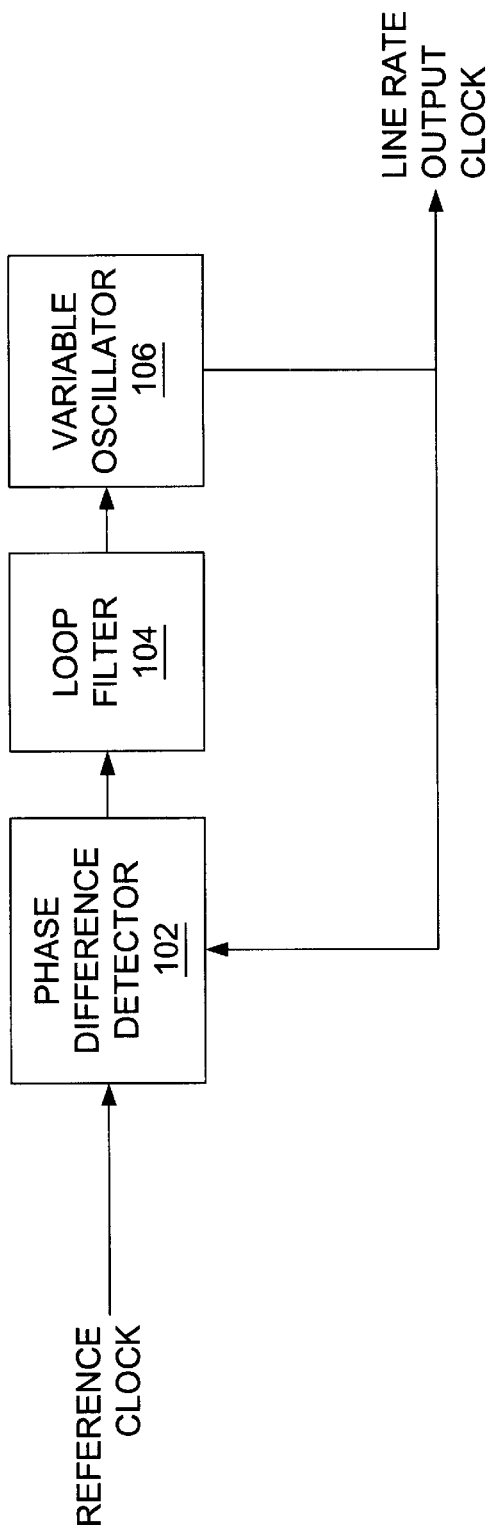
FIG. 1 schematically illustrates a typical phase locked loop implementation of a phase noise filter.

A typical PLL implementation of a phase noise filter 100 is illustrated in FIG. 1. A line rate output clock is output from a variable oscillator 106 that is controlled by a signal from a loop filter 104. Output from variable oscillator 106 is compared to a reference clock at a phase difference detector 102 (also know as a phase comparator) whose output, which is related to a phase difference between the reference clock and the line rate output clock, is passed to loop filter 104 whose output is used to control variable oscillator 106 to reduce the magnitude of the phase difference. Note that, to achieve jitter filtering, phase noise filter 100 requires a low bandwidth, which is determined by loop filter 104. When a voltage controlled crystal oscillator (VCXO) is used for variable oscillator 106, the line rate output clock has low phase noise. Unfortunately, because of a narrow tuning range, a VCXO with a nominal a frequency close to the bit rate of the reference clock signal must be used. Alternatively, a voltage controlled oscillator (VCO) may be used for variable oscillator 106 for a relatively wide range of reference clock bit rates, however, the intrinsic phase noise in the resulting line rate output clock may preclude its use in many applications. The intrinsic phase noise of a VCO would be corrected by a PLL with a wide enough bandwidth, however such a wide bandwidth PLL would not reduce the jitter on the reference clock.

To avoid these problems, the subject invention implements a low bandwidth PLL phase noise filter that uses a synthesizer to convert a low phase noise VCXO output to a signal with a frequency having a pre-determined relationship to the reference clock. In one embodiment, the output of the phase noise filter is synthesized from the output of a high speed, wide bandwidth, frequency scaling PLL incorporating a VCO; this requires that the bandwidth of the high speed, wide bandwidth, frequency scaling PLL be set wide enough to correct the phase noise inherent in the output of the VCO. Unlike the standard VCXO-based approach, the low bandwidth PLL of the present invention may be used for filtering jitter from a wide range of reference clock bit rates.

In use, the preferred frequency of the line rate output clock may not be identical to the frequency of the reference clock, but will have a relationship to it. The relationship between the reference clock frequency, $f_i$, and the line rate output clock frequency, $f_o$, may be one of the following (where S and W are integers):

$f_o = f_i$, $f_o = f_i$, (e.g., the input clock is a word clock while the output clock is a serial clock);

$$f_o = \frac{f_i}{W}$$

e.g., the input clock is a serial clock while the output clock is a word clock); and $$f_o = \frac{S}{W} \times f_i$$

(e.g., the output clock has a slightly higher rate than the input clock to accommodate extra data).

Advantageously, by virtue of the inclusion of a synthesizer to allow for operation over a wide range of reference clock frequencies, the phase noise filter of the present invention also allows for conversion of the reference clock to a line rate clock having a frequency with a predetermined rational relationship to the reference clock frequency.

Figure 2:
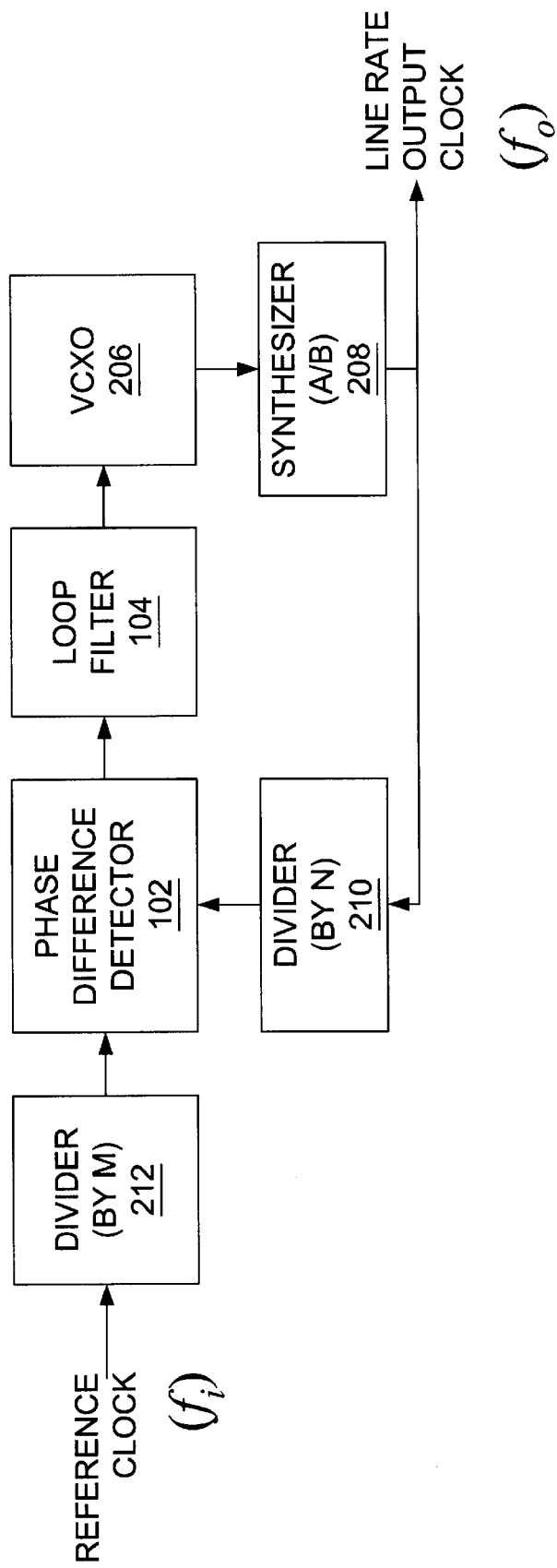
FIG. 2 schematically illustrates a phase noise filter in accordance with a first embodiment of the present invention.

In an implementation of a phase noise filter 200, illustrated in FIG. 2, a VCXO 206 is used in place of variable oscillator 106 of FIG. 1 and a signal from loop filter 104 is used to control VCXO 206. The output of VCXO 206 is received by a synthesizer 208 whose output signal has a frequency which is a rational (A/B) multiple of the frequency of the signal at the output of VCXO 206. The output of synthesizer 208 is fed back, via a feedback divider (by N) 210, to phase difference detector 102 where it maybe compared to the reference clock divided down by an input divider (by MA 212. After a phase lock acquiring time interval, the output of synthesizer 208 is phase synchronous with the reference clock. Considering, at first, phase noise filter 200 in the absence of input divider 212 and feedback divider 210, synthesizer 208 may be used to convert the frequency of the signal at the output of VCXO 206 to the frequency of the reference clock. Through the use of synthesizer 208, then, the narrow tuning range limitation of VCXO 206 may be overcome such that the bit rate of the reference clock signal need not b close to the nominal frequency of VCXO 206. The frequency of the output of phase noise filter 200 is, however, limited to the range of frequencies of which synthesizer 208 is capable.

In the simplest case, where the desired $f_o$ is within the range of synthesizer 208 and where the desired $f_o$ is equal to $f_i$, then input divider (by M) 212 and feedback divider (by N) 210 are not required. In the case where frequency conversion is required, M and N can be chosen to achieve the desired result. The main problem with this simple form of phase noise filter 200 is that practical synthesizers may not be capable both of low jitter and high frequency.

Figure 3:
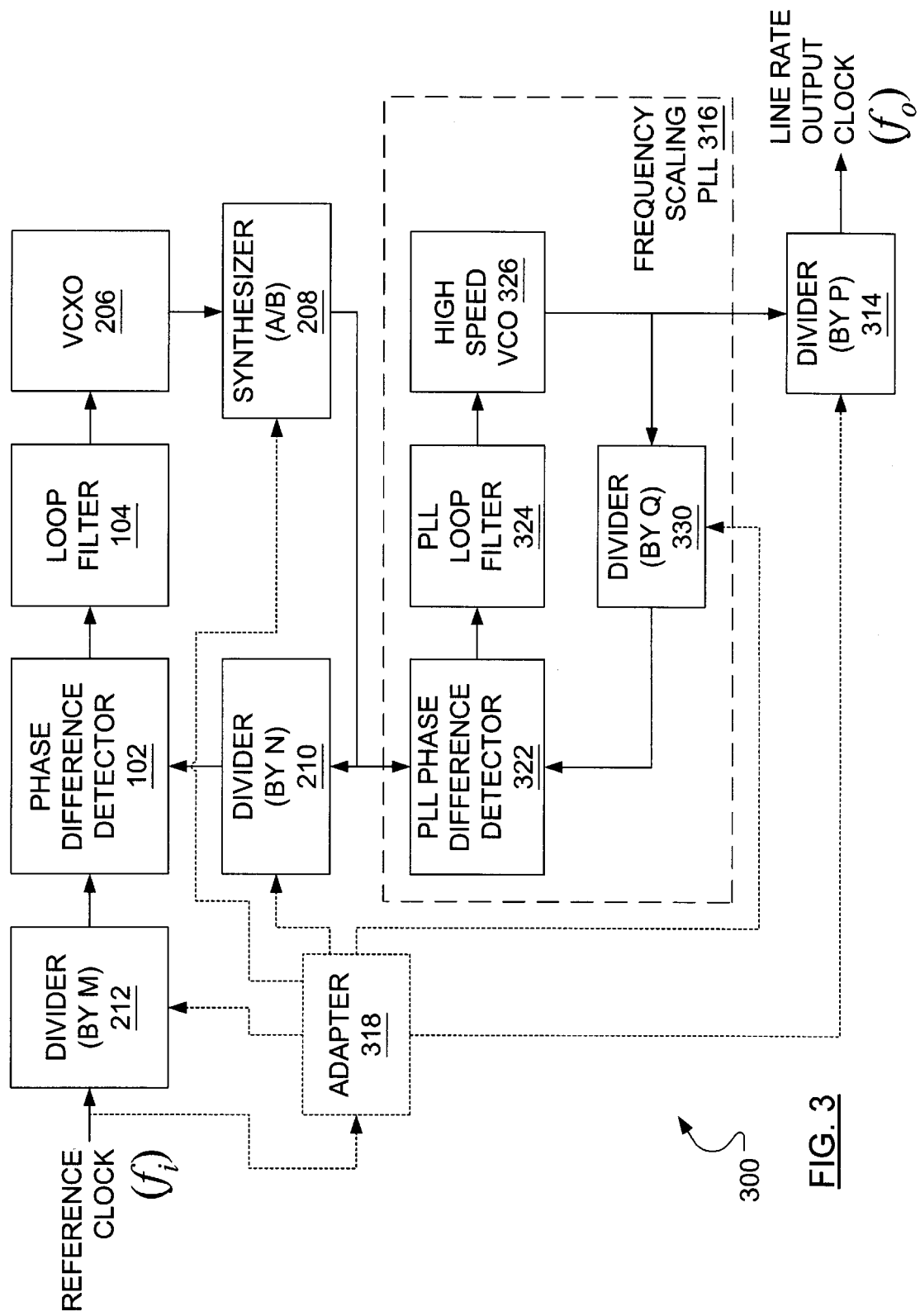
FIG. 3 schematically illustrates a phase noise filter in accordance with a second embodiment of the present invention.

The frequency capability limitation of practical synthesizers is addressed by a phase noise filter 300, illustrated in FIG. 3. In phase noise filter 300, the output of phase noise filter 200 (FIG. 2) is passed to a frequency multiplier. In the embodiment illustrated in FIG. 3 the frequency multiplier is implemented as a high speed frequency scaling PLL 316. Within frequency scaling PLL 316, a PLL phase difference detector 322 receives an input signal from synthesizer 208 and compares it to a feedback signal. Output from PLL phase difference detector 322 is filtered by a PLL loop filter 324 and used to control a high speed VCO 326. The output of high speed VCO 326 is output from frequency scaling PLL 316 and may be passed to an output divider (by P) 314. The output of high speed VCO 326 is also fed back to PLL phase difference detector 322 via a PLL feedback divider (by Q) 330 which acts to divide the frequency of the signal at the output of high speed VCO 326 down to the frequency of the output of synthesizer 208. Note that the values given to synthesizer (A/B) 208, dividers (by N) 210, (by M) 212, (by Q) 330 and (by P) 314 are selected with knowledge a of nominal frequencies for VCXO 206 and high speed VCO 326, and are used to implement a desired relationship between $f_i$ and $f_o$, $$f_o = \frac{QN}{PM} f_i.$$

The selection may be performed by a designer of the filter or, alternatively, by an adapter 318 having the intelligence to adaptively select based on a sensed reference clock bit rate, the desired relationship between reference clock bit rate and line rate and knowledge of nominal frequencies and tuning ranges for VCXO 206 and high speed VCO 326.

Note that availability to provide sufficient tuning range with VCO 326 is assumed. This could be achieved by a single VCO with an octave control range or a selectable bank of VCOs with overlapping ranges providing overall one octave of range.

A special case exists wherein, for synthesizer (A/B) 208, A=1 and synthesizer 208 may be called a divider. However, this special case is only practical when B and Q are small. Noise at the output of frequency scaling PLL 316 increases with the scaling factor, Q. Consequently, if a desired output frequency requires a large Q, the noise on the output may exceed prescribed limits.

In the following examples, the nominal frequency of VCXO 206, $f_{VCXO}$, is 51.84 MHz and the nominal frequency of VCO 326, $f_{VCO}$, is 2.48832 GHz with a ±35% tuning range. It is assumed that there is a limitation on the synthesizer output frequency such that it may not exceed one third of the synthesizer input frequency, that is, $$f_{synth} \le \frac{f_{VCXO}}{3}$$

or equivalently $A/B \le 1/3$. Further, B is fixed at $2_{16}$ (65536) and {Q,M,N,P} may not exceed 256.

For a first example, consider a particular phase noise filter with no requirement for frequency conversion (i.e. desired $f_o=f_i$) and an input frequency $f_i=155.52$ MHz. The required output frequency, then, is $f_o=155.52$ MHz. One set of divider parameters which accomplish this are N=1, M=12, A=$2^{14}$=16384, Q=192 and P=16. Note that VCO 326 tunes, in this example, to its nominal frequency, 2.48832 GHz and the frequency of synthesizer 208 output is 12.96 MHz.

For a second example, consider another phase noise filter with no requirement for frequency conversion (i.e. $f_o=f_i$) and an input frequency $f_i=125$ MHz. The output required frequency, then, is $f_o=125$ MHz. One set of divider parameters which accomplish this are N=1, M=8, A=19753, Q=160 and P=20. Note that VCO 326 tunes, in this example, to 2.5 GHz and the frequency of synthesizer 208 output is 15.625 MHz.

For a third example, consider a phase noise filter used to convert from a reference byte clock to serial line clock (i.e. $f_o=Xf_i$), where X=8 and input frequency $f_i=77.76$ MHz. The required output frequency, then, is $f_o=8\times77.76$ MHz=622.08 MHz. One set of divider parameters which accomplish this are N=1, M=6, A=16384, Q=192 and P=4. Note that VCO 326 tunes, in this example, to its nominal frequency, 2.48832 GHz and the frequency of synthesizer 208 output is 12.96 MHz.

For a fourth example, consider a phase noise filter used to convert from a reference word clock to serial line clock (i.e. $f_o=Xf_i$), where X=10 and an input frequency $f_i=125$ MHz. The required output frequency, then, is $f_o=10\times125$ MHz=1250 MHz. One set of divider parameters which accomplish this are N=1, M=8, A=19753, Q=160 and P=2. Note that VCO 326 tunes, in this example, to 2.5 GHz and the frequency of synthesizer 208 output is 15.625 MHz.

For a fifth example, consider a phase noise filter used to create a slightly higher output frequency to accommodate an overlaid but synchronous frame structure such as for forward error correction (i.e. $f_o=Y/Zf_i$), where Y=15, Z=14 and input frequency $f_i=2.48832$ MHz. The required output frequency, then, is $f_o=(15/14)\times2.48832$ GHz=2.66606 GHz. One set of divider parameters which accomplish this are N=1, M=12×14=168, A=18724, Q=12×15=180 and P=1. Note that VCO 326 tunes, in this example, to 2666.06 MHz and the frequency of synthesizer 208 output is 14.8114 MHz.

Figure 4:
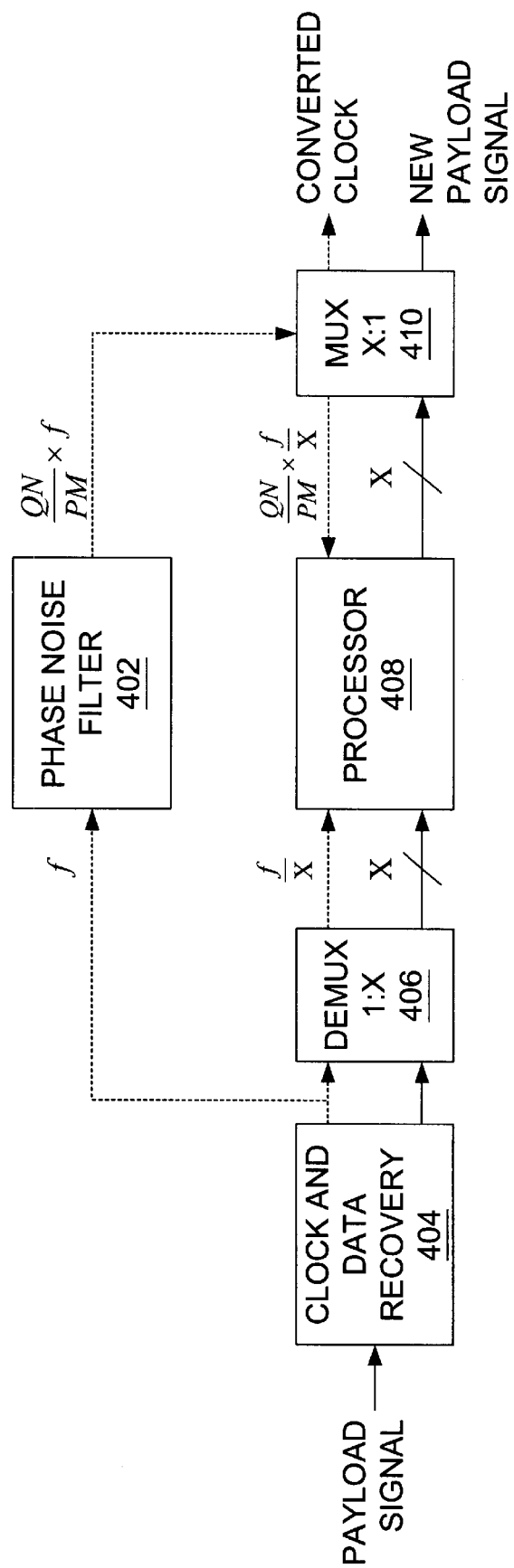
FIG. 4 schematically illustrates a typical interface using a phase noise filter in accordance with an embodiment of the present invention.

Turning to FIG. 4, a phase noise filter (with frequency conversion) 402 is illustrated in use in a typical interface 400. The overall purpose of interface 400 may be to wrap a payload signal such that some overhead data may be incorporated in the output signal. In other applications, interface 400 may pass data through while filtering jitter from the clock associated with the data or interface 400 may be used to strip overhead data from a signal. Consequently, the clock on the output may require a frequency that differs from that of the payload clock yet still complies with jitter requirements of the overall system in which interface 400 is employed.

In one operation, a payload data signal arrives at a clock and data recovery unit 404 wherein a payload clock is discerned from the data transitions. Both the re-timed data and recovered payload clock (at frequency) are passed to 1:X (where X=1, 4, 8, 16 . . . ) de-multiplexer (DEMUX) 406 whose output, comprising X-bit words of payload and the payload clock divided down by X, is passed to a processor 408. Protocol specific information, parity and/or other data obtained as a result of time domain functions performed on the input X-bit words may be included by processor 408 in the X-bit words output to a multiplexer (MUX) 410. The timing of the passing of output words from processor 408 to MUX 410 is determined by a word output clock passed from MUX 410 to processor 408, where the word output clock is derived from a converted clock received by MUX 410 from phase noise filter 402. The (low phase noise) converted clock is obtained by phase noise filter 402 based on the payload clock received from clock and data recovery unit 404. The output of MUX 410 is a serial data stream including both payload data and overhead data with a timing determined by the converted clock received from phase noise filter 402. The converted clock is also available at the output of MUX 410.

Figure 5:
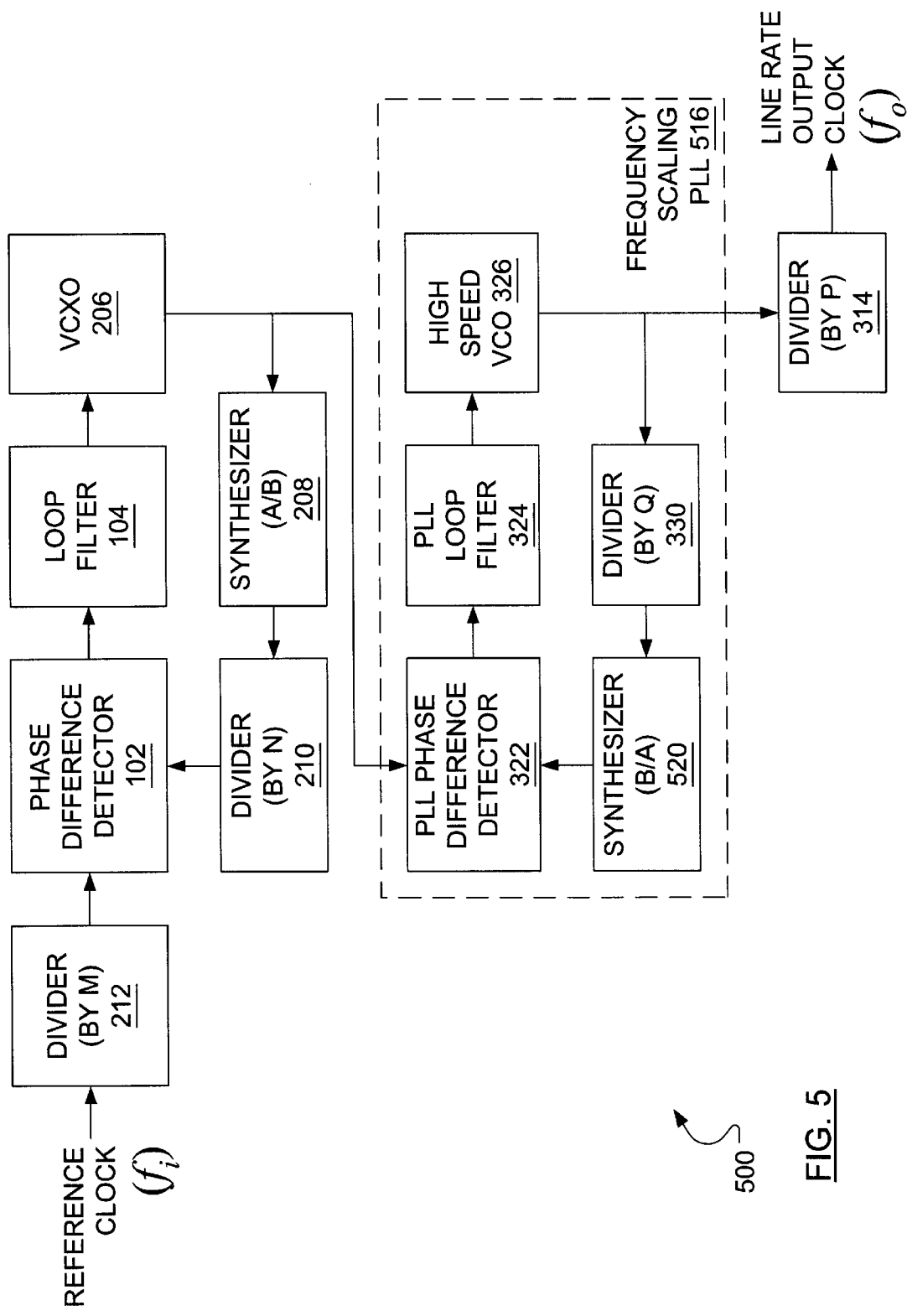
FIG. 5 schematically illustrates a phase noise filter in accordance with a third embodiment of the present invention.

FIG. 5 illustrates a second implementation of a phase noise filter 500, wherein the filter PLL of FIG. 2 is cascaded with a frequency multiplier, as in FIG. 3. However, in contrast to phase noise filter 300 of FIG. 3, a high speed frequency scaling PLL 516 receives (low phase noise) input directly from VCXO 206. Consequently, synthesizer (A/B) 208 is included in the feedback loop with feedback divider (by N) 210. This change necessitates inclusion, in frequency scaling PLL 516, of a synthesizer (B/A) 520 in the feedback loop with PLL feedback divider (by Q) 330.

Illustrated in FIG. 6 is a third implementation of a phase noise filter 600. In this case, the frequency scaling is embedded within the original filter loop, first described with reference to FIG. 2. As in phase noise filter 500 of FIG. 5, frequency scaling PLL 516 receives input directly from VCXO 206 and passes output to output divider (by P) 314, if necessary. Where "embedded" phase noise filter 600 differs from "cascaded" filters 300 (FIG. 3) and 500 (FIG. 5) is in the feedback path. The feedback path, through feedback divider (by N) 210 to phase difference detector 102, has an origin at the output of filter 600 rather than at the output of synthesizer 208 (as in FIGS. 2 and 3) or VCXO 206 (as in FIG. 5).

Note that output divider (by P) 314 need not be embedded in the loop. The origin of the feedback path could be the output of frequency scaling PLL 516. Further, output division may be accomplished using two dividers, having division values $P_1$ and $P_2$, where $P=P_1P_2$. Consider that the output of frequency scaling PLL 516 passes to a divider by $P_1$ which passes output to a divider by $P_2$. Given an appropriate relationship between N and $P_1$, the feedback path may originate between the divider by $P_1$ and the divider by $P_2$. For instance, a value of $P_1=N$ would obviate a need for a divider in the feedback path.

As will be apparent to a person skilled in the art, synthesizer techniques which may be used in synthesizers 208 (FIGS. 2, 3 and 5) and 520 (FIGS. 5 and 6) include fractional counters, gapped clocks, dual dividers and direct digital synthesis, among others.

Other modifications will be apparent to those skilled in the art and, therefore, the invention is defined in the claims.

We claim:

1. An agile phase noise filter comprising:
    a first phase difference detector for detecting a first phase difference and generating a signal representative of said first phase difference, where said first phase difference may exist between a reference signal and a first feedback signal;
    a first loop filter for filtering said signal representative of said first phase difference to obtain a first filtered signal;
    a variable frequency signal source for generating a low phase noise signal, where a frequency of said low phase noise signal is varied according to changes in said first filtered signal and where said varying tends to reduce said first phase difference;
    a first synthesizer for generating a synthesized signal, where said synthesized signal is phase locked with said reference signal, is dependent upon said low phase noise signal and where a frequency of said synthesized signal has a first pre-determined relationship with a frequency of said reference signal;
    a frequency multiplier including a frequency scaling phase locked loop including:
        a second phase difference detector for detecting a second phase difference and generating a signal representative of said second phase difference, where said second phase difference may exist between a signal input to said frequency scaling phase locked loop and a second feedback signal fed back from the output of said frequency scaling phase locked loop;
        a second loop filter for filtering said signal representative of said second phase difference to obtain a second filtered signal;
        a high speed variable frequency signal source for generating a frequency scaling phase locked loop output signal, where a frequency of said output signal is varied according to changes in said second filtered signal and where said varying tends to reduce said second phase difference;
        a second feedback divider for reducing a frequency of said frequency scaling phase locked loop output signal to obtain a divided output signal; and
        a second synthesizer for generating said second feedback signal, where said second feedback signal is phase locked with said signal input to said frequency scaling phase locked loop, is synthesized from said divided output signal and where a frequency of said second feedback signal approximates a frequency of said signal input to said frequency scaling phase locked loop.

2. The filter of claim 1 further comprising an output divider to reduce said frequency of said frequency scaling phase locked loop output signal to a frequency having a third pre-determined relationship with said frequency of said reference signal.

3. An agile phase noise filter comprising:
    a first phase difference detector for detecting a first phase difference and generating a signal representative of said first phase difference, where said first phase difference may exist between a reference signal and a first feedback signal;
    first loop filter for filtering said signal representative of said first phase difference to obtain a first filtered signal;
    a variable frequency signal source for generating a low phase noise signal, where a frequency of said low phase noise signal is varied according to changes in said first filtered signal and where said varying tends to reduce said first phase difference;
    a first synthesizer for generating a synthesized signal, where said synthesized signal is phase locked with said reference signal, is dependent upon said low phase noise signal and where a frequency of said synthesized signal has a first pre-determined relationship with a frequency of said reference signal;
    a frequency multiplier including a frequency scaling phase locked loop including:

a second phase difference detector for detecting a second phase difference and generating a signal representative of said second phase difference, where said second phase difference may exist between a signal input to said frequency scaling phase locked loop and a second feedback signal fed back from the output of said frequency scaling phase locked loop;

a second loop filter for filtering said signal representative of said second phase difference to obtain a second filtered signal;

a high speed variable frequency signal source for generating a frequency scaling phase locked loop output signal, where a frequency of said output signal is varied according to changes in said second filtered signal and where said varying tends to reduce said second phase difference;

a second feedback divider for reducing a frequency of said frequency scaling phase locked loop output signal to obtain a divided output signal; and where said first synthesizer synthesizes said second feedback signal from said divided output signal and where a frequency of said second feedback signal approximates a frequency of said signal input to said frequency scaling phase locked loop.

4. A method of filtering phase noise from a reference signal of arbitrary rate comprising:

detecting a phase difference between said reference signal and a feedback signal;

generating a signal representative of said detected phase difference;

filtering said signal representative of said detected phase difference to obtain a filtered signal;

using said filtered signal to vary a frequency of a low phase noise signal, where said varying tends to reduce said detected phase difference;

using a synthesizer to synthesize a synthesized signal phase locked with said reference signal and dependent on said low phase noise signal wherein frequency of said synthesized signal has a first pre-determined relationship with a frequency of said reference signal; and multiplying said frequency of said low phase noise signal, said multiplying including:

detecting a second phase difference between a multiplier input signal and a second feedback signal based on a multiplier output signal;

generating a signal representative of said second phase difference;

filtering said signal representative of said second phase difference to obtain a second filtered signal;

using said second filtered signal to vary a frequency of said multiplier output signal, where said varying tends to reduce said second phase difference;

reducing said frequency of said multiplier output signal to obtain a divided output signal; and using a second synthesizer to synthesize said second feedback signal phase locked with said multiplier input signal and synthesized from said divided output signal, where a frequency of said second feedback signal approximates a frequency of said multiplier input signal.

5. The method of claim 4 further comprising reducing said frequency of said multiplier output signal to a frequency having a third pre-determined relationship with said frequency of said reference signal.

6. A method of filtering phase noise from a reference signal of arbitrary rate comprising:

detecting a phase difference between said reference signal and a feedback signal;

generating a signal representative of said detected phase difference;

filtering said signal representative of said detected phase difference to obtain a filtered signal;

using said filtered signal to vary a frequency of a low phase noise signal, where said varying tends to reduce said detected phase difference;

using a synthesizer to synthesize a synthesized signal phase locked with said reference signal and dependent on said low phase noise signal, where a frequency of said synthesized signal has a first pre-determined relationship with a frequency of said reference signal; and multiplying said frequency of said low phase noise signal, said multiplying including:

detecting a second phase difference between a multiplier input signal and a second feedback signal based on a multiplier output signal;

generating a signal representative of said second phase difference;

filtering said signal representative of said second phase difference to obtain a second filtered signal;

using said second filtered signal to vary a frequency of said multiplier output signal, where said varying tends to reduce said second phase difference;

reducing said frequency of said multiplier output signal to obtain a divided output signal; and using said synthesizer to synthesize said second feedback signal from said divided output signal, where a frequency of said second feedback signal approximates a frequency of said multiplier input signal.

* * * * *

UNITED STATES PATENT AND TRADEMARK OFFICE
CERTIFICATE OF CORRECTION

PATENT NO.      : 6,333,678 B1                                             Page 1 of 1
DATED           : December 25, 2001
INVENTOR(S)     : Brown et al.

It is certified that error appears in the above-identified patent and that said Letters Patent is hereby corrected as shown below:

Column 4,
Line 61, delete "(by MA 212." and insert -- (by M) 212. --.

Column 8,
Line 52, delete "first loop" and insert -- a first loop --.

Column 9,
Line 38, delete "noise signal wherein and insert -- noise signal, where --.

Signed and Sealed this

Twenty-sixth Day of November, 2002

Attest:

JAMES E. ROGAN
Attesting Officer          Director of the United States Patent and Trademark Office

UNITED STATES PATENT AND TRADEMARK OFFICE
CERTIFICATE OF CORRECTION

PATENT NO.   : 6,333,678 B1
DATED        : December 25, 2001
INVENTOR(S)  : Brown et al.

It is certified that error appears in the above-identified patent and that said Letters Patent is hereby corrected as shown below:

Column 4,
Line 61, delete "(by MA 212." and insert -- (by M) 212. --.

Column 8,
Line 52, delete "first loop" and insert -- a first loop --.

Column 9,
Line 38, delete "noise signal wherein" and insert -- noise signal, where --.

Signed and Sealed this

Third Day of August, 2004

JON W. DUDAS
*Acting Director of the United States Patent and Trademark Office*

UNITED STATES PATENT AND TRADEMARK OFFICE
CERTIFICATE OF CORRECTION

| | |
|---|---|
| PATENT NO. | : 6,333,678 B1 |
| APPLICATION NO. | : 09/570033 |
| DATED | : December 25, 2001 |
| INVENTOR(S) | : Brown et al. |

It is certified that error appears in the above-identified patent and that said Letters Patent is hereby corrected as shown below:

On the title page, insert Item (30) as follow: insert

-- (30) Foreign Application Priority Data
     Dec. 29, 1999 [CA]   Canada ..........2293173 --

Signed and Sealed this

Sixth Day of February, 2007

JON W. DUDAS
*Director of the United States Patent and Trademark Office*